(12) United States Patent
Lin et al.

(10) Patent No.: US 9,433,108 B2
(45) Date of Patent: Aug. 30, 2016

(54) METHOD OF FABRICATING A CIRCUIT BOARD STRUCTURE HAVING AN EMBEDDED ELECTRONIC ELEMENT

(71) Applicant: Unimicron Technology Corporation, Taoyuan (TW)

(72) Inventors: Yung-Ching Lin, Taoyuan (TW); Chih-Kuie Yang, Taoyuan (TW); Ta-Han Lin, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 186 days.

(21) Appl. No.: 14/097,597

(22) Filed: Dec. 5, 2013

(65) Prior Publication Data

US 2014/0201992 A1 Jul. 24, 2014

(30) Foreign Application Priority Data

Jan. 23, 2013 (TW) .............................. 102102423 A

(51) Int. Cl.
*H05K 3/46* (2006.01)
*H05K 1/18* (2006.01)

(52) U.S. Cl.
CPC ............ *H05K 3/4647* (2013.01); *H05K 1/185* (2013.01); *H05K 2201/0358* (2013.01); *H05K 2203/1189* (2013.01); *Y10T 29/49155* (2015.01)

(58) Field of Classification Search
CPC ...... H05K 3/46; H05K 3/464; H05K 3/4673; H05K 2/4697; H05K 1/185; H05K 3/4647; H05K 2201/0358; H05K 2203/1189; Y10T 3/4647

See application file for complete search history.

(56) References Cited

U.S. PATENT DOCUMENTS

2007/0190686 A1 8/2007 Wang

FOREIGN PATENT DOCUMENTS

| CN | 100345279 C | 10/2007 |
| JP | 2003-218282 A | 7/2003 |
| JP | 3853219 B2 * | 12/2006 |
| TW | I295912 B | 4/2008 |

* cited by examiner

*Primary Examiner* — Carl Arbes
(74) *Attorney, Agent, or Firm* — Mintz Levin Cohn Ferris Glovsky and Popeo, P.C.; Peter F. Corless; Steven M. Jensen

(57) ABSTRACT

A method for fabricating a circuit board structure having at least an embedded electronic element is disclosed, which includes the steps of: providing a substrate and embedding at least an electronic element in the substrate with an active surface and a plurality of electrode pads of the electronic element exposed from a surface of the substrate; forming a plurality of conductive bumps on the electrode pads of the electronic element; and covering the surface of the substrate and the active surface of the electronic element with a dielectric layer and a metal layer stacked on the dielectric layer, wherein the conductive bumps penetrate the dielectric layer so as to be in contact with the metal layer, thereby simplifying the fabrication process, reducing the fabrication cost and saving the fabrication time.

6 Claims, 4 Drawing Sheets

METHOD OF FABRICATING A CIRCUIT BOARD STRUCTURE HAVING AN EMBEDDED ELECTRONIC ELEMENT

CROSS-REFERENCES TO RELATED APPLICATIONS

This application claims under 35 U.S.C. §119(a) the benefit of Taiwanese Application No. 102102423, filed Jan. 23, 2013, the entire contents of which is incorporated herein by reference.

BACKGROUND OF THE INVENTION

1. Field of the Invention

The present invention relates to circuit board structures and fabrication methods thereof, and more particularly, to a circuit board structure having at least an embedded electronic element and a fabrication method thereof.

2. Description of Related Art

Along with the progress of semiconductor packaging technologies, various package types have been developed for semiconductor devices. For example, an electronic element can be embedded in and electrically connected to a packaging substrate so as to form a package. Such a package has reduced size and improved electrical performance and therefore has become a main trend.

FIGS. 1A to 1F are schematic cross-sectional views showing a circuit board structure having embedded electronic elements and a fabrication method thereof according to the prior art.

Referring to FIG. 1A, a substrate 10 is provided, which has opposite first and second surfaces 10a, 10b and a cavity 100 penetrating the first and second surfaces 10a, 10b. An adhesive layer 11 is formed on the second surface 10b of the substrate 10 to cover one end of the cavity 100, and a plurality of electronic elements 12 are disposed on the adhesive layer 11 in the cavity 100. Each of the electronic elements 12 has a first active surface 12a having a plurality of first electrode pads 121a and a second active surface 12b opposite to the first active surface 12a and having a plurality of second electrode pads 121b. The first active surfaces 12a and the first electrode pads 121a of the electronic elements 12 are exposed from the first surface 10a of the substrate 10.

Referring to FIG. 1B, a first dielectric layer 13a is laminated on the first surface 10a of the substrate 10 and the first active surfaces 12a of the electronic elements 12. Further, the first dielectric layer 13a flows into the cavity 100 so as to cover side surfaces of the electronic elements 12.

Referring to FIG. 1C, the adhesive layer 11 is removed to expose the second active surfaces 12b and the second electrode pads 121b of the electronic elements 12 from the second surface 10b of the substrate 10. Then, a second dielectric layer 13b is laminated on the second surface 10b of the substrate 10 and the second active surfaces 12b of the electronic elements 12. Thereafter, the first dielectric layer 13a is covered with a first copper foil 14a, and the second dielectric layer 13b is covered with a second copper foil 14b.

Referring to FIG. 1D, a brown oxide treatment is applied to the first and second copper foils 14a, 14b, and a laser drilling process is performed to form a plurality of first openings 130a through the first copper foil 14a and the first dielectric layer 13a to expose the first electrode pads 121a and form a plurality of second openings 130b through the second copper foil 14b and the second dielectric layer 13b to expose the second electrode pads 121b.

Referring to FIG. 1E, a conductive layer 15 is formed on walls of the first and second openings 130a, 130b by electroless plating.

Referring to FIG. 1F, an electroplating process is performed through the conductive layer 15 so as to form a plurality of first conductive vias 16a in the first openings 130a and form a plurality of second conductive vias 16b in the second openings 130b, thus electrically connecting the first and second copper foils 14a, 14b through the first and second conductive vias 16a, 16b.

However, in the above-described method, the laser drilling, electroless plating and electroplating processes are complicated, costly and time-consuming.

Therefore, there is a need to provide a circuit board structure having at least an embedded electronic element and a fabrication method thereof so as to overcome the above-described drawbacks.

SUMMARY OF THE INVENTION

In view of the above-described drawbacks, the present invention provides a circuit board structure having at least an embedded electronic element, which comprises: a substrate having opposite first and second surfaces; at least an electronic element embedded in the substrate, wherein the electronic element has a first active surface having a plurality of first electrode pads and a second active surface opposite to the first active surface and having a plurality of second electrode pads, the first active surface and the first electrode pads of the electronic element being exposed from the first surface of the substrate; a plurality of first conductive bumps formed on the first electrode pads of the electronic element, wherein each of the first conductive bumps is bonded to the corresponding first electrode pad through a bottom portion thereof and the bottom portion is greater in width than an opposite top portion of the first conductive bump; a first dielectric layer formed on the first surface of the substrate and the first active surface of the electronic element and penetrated by the first conductive bumps; and a first metal layer formed on the first dielectric layer and the first conductive bumps and in contact with the first conductive bumps.

The present invention further provides a method for fabricating a circuit board structure having at least an embedded electronic element, which comprises the steps of: providing a substrate having opposite first and second surfaces and embedding at least an electronic element in the substrate, wherein the electronic element has a first active surface having a plurality of first electrode pads and a second active surface opposite to the first active surface and having a plurality of second electrode pads, the first active surface and the first electrode pads of the electronic element being exposed from the first surface of the substrate; forming a plurality of first conductive bumps on the first electrode pads of the electronic element; and covering the first surface of the substrate and the first active surface of the electronic element with a first dielectric layer and a first metal layer stacked on the first dielectric layer, wherein the first conductive bumps penetrate the first dielectric layer so as to be in contact with the first metal layer.

Therefore, the present invention dispenses with the conventional laser drilling, electroless plating and electroplating processes so as to simplify the fabrication process, reduce the fabrication cost and save the fabrication time.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "top", "bottom", "end", "a" etc. are merely for illustrative purposes and should not be construed to limit the scope of the present invention.

FIGS. 2A to 2G are schematic cross-sectional views showing a circuit board structure having at least an embedded electronic element and a fabrication method thereof according to the present invention.

Figure 1A:
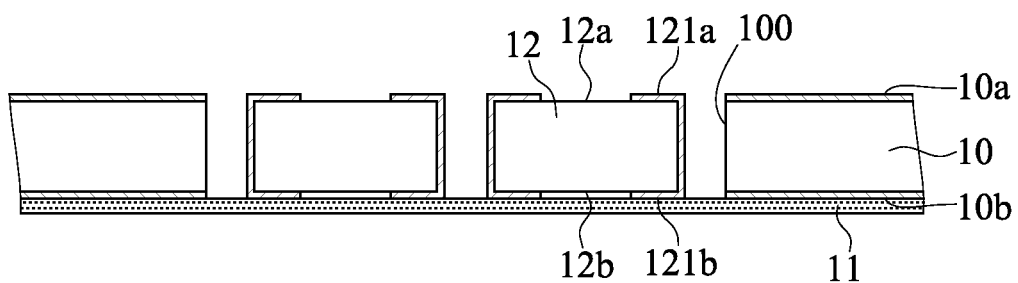
FIGS. 1A to 1F are schematic cross-sectional views showing a circuit board structure having embedded electronic elements and a fabrication method thereof according to the prior art.
Figure 1B:
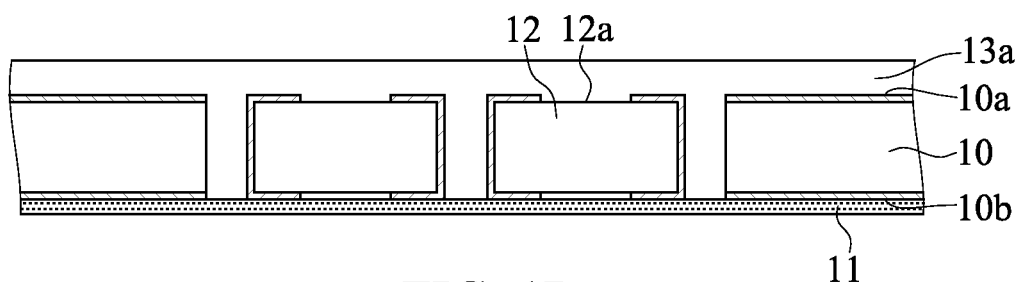
Figure 1C:
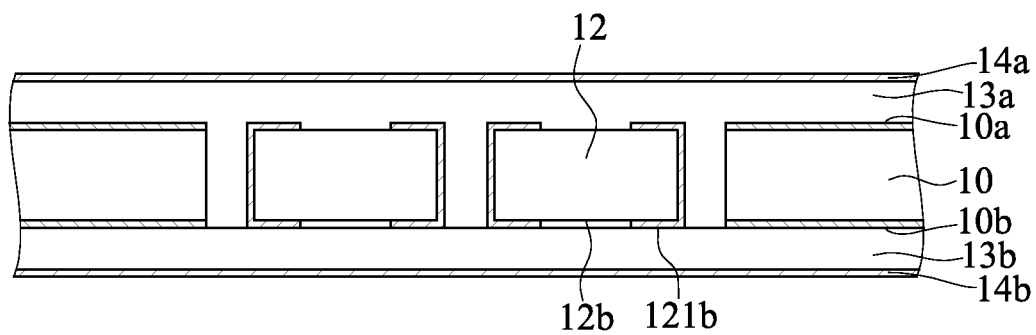
Figure 1D:
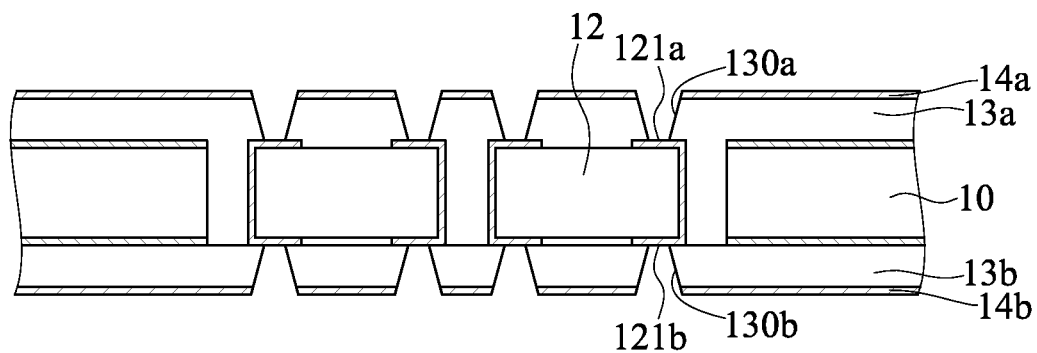
Figure 1E:
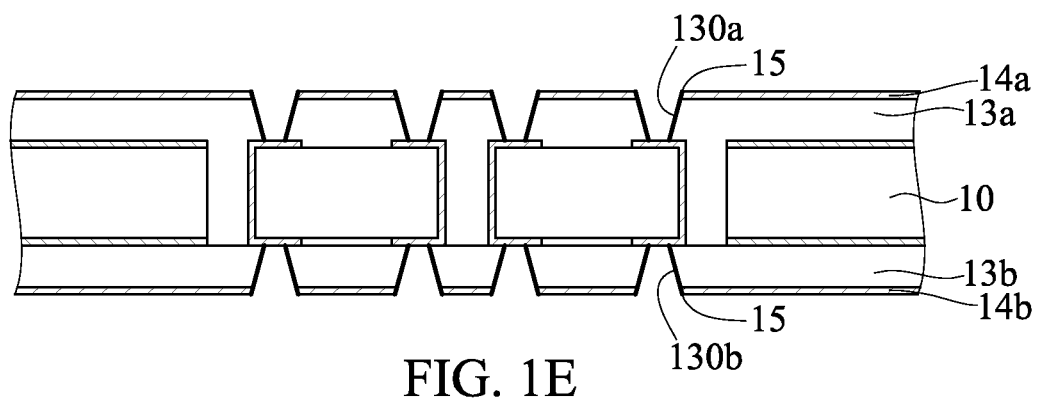
Figure 1F:
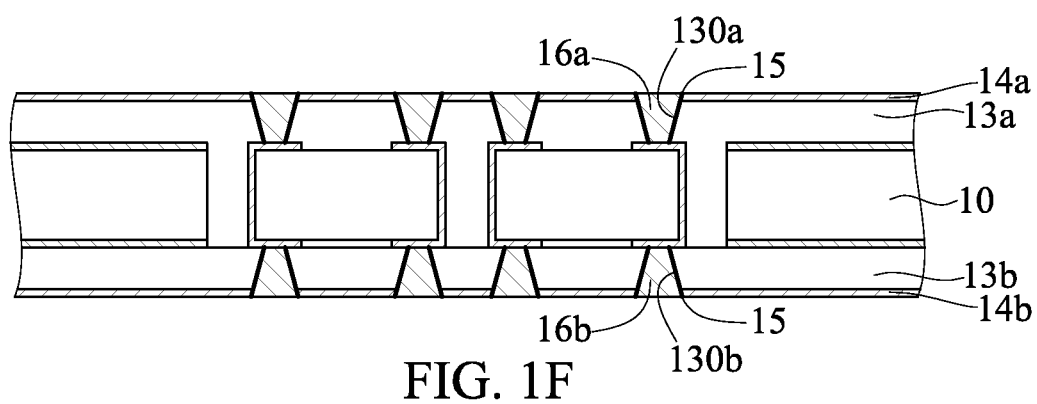
Figure 2A:
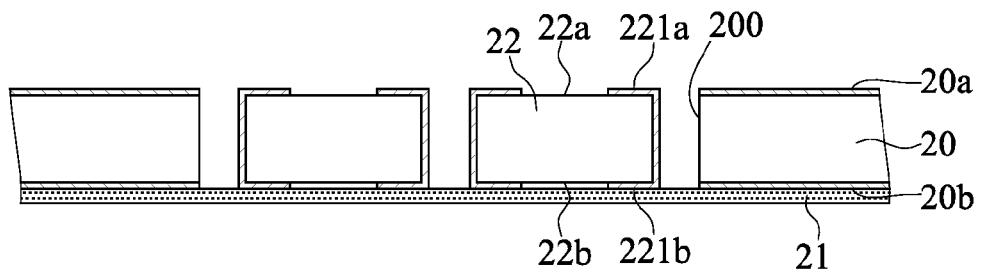
FIGS. 2A to 2G are schematic cross-sectional views showing a circuit board structure having at least an embedded electronic element and a fabrication method thereof according to the present invention.

Referring to FIG. 2A, a substrate 20 is provided, which has opposite first and second surfaces 20a, 20b and a cavity 200 penetrating the first and second surfaces 20a, 20b. An adhesive layer 21 is formed on the second surface 20b of the substrate 20 for covering one end of the cavity 200, and at least an electronic element 22 is disposed on the adhesive layer 21 in the cavity 200. In the present embodiment, a plurality of electronic elements 22 are disposed on the adhesive layer 21 in the cavity 200. Each of the electronic elements 22 has a first active surface 22a having a plurality of first electrode pads 221a and a second active surface 22b opposite to the first active surface 22a and having a plurality of second electrode pads 221b. The first active surface 22a and the first electrode pads 221a of the electronic element 22 are exposed from the first surface 20a of the substrate 20. The electronic element 22 can be a capacitor, such as a multi-layer ceramic capacitor (MLCC).

Figure 2B:
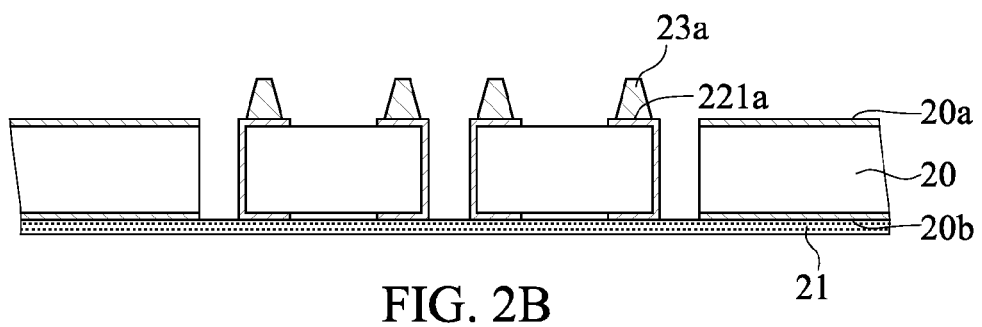

Referring to FIG. 2B, a plurality of first conductive bumps 23a made of such as silver paste are formed on the first electrode pads 221a by printing and heated so as to be cured. Each of the first conductive bumps 23a is bonded to the corresponding first electrode pad 221a through a bottom portion thereof and the bottom portion is greater in width than an opposite top portion of the first conductive bump 23a.

Figure 2C:
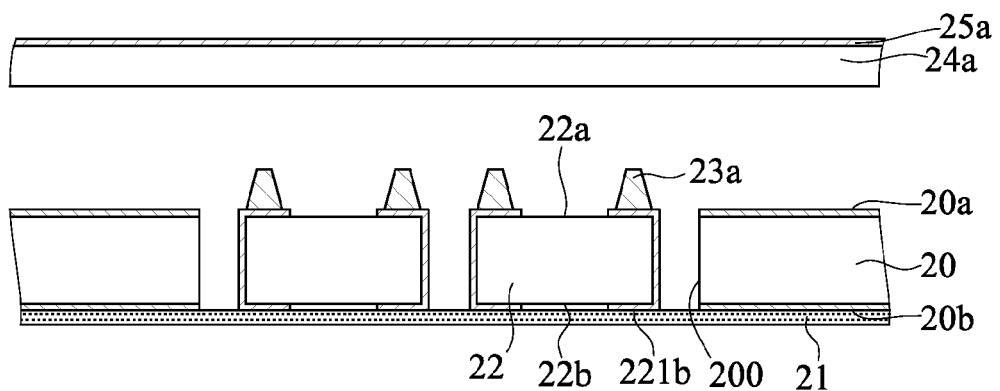
Figure 2D:
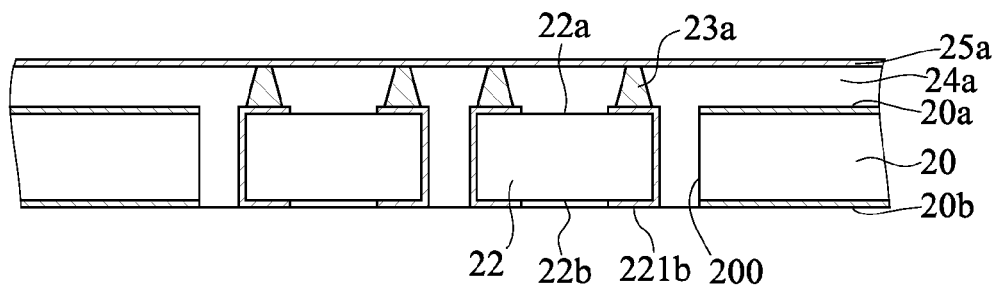

Referring to FIGS. 2C and 2D, the first surface 20a of the substrate 20 and the first active surfaces 22a of the electronic elements 22 are covered with a first dielectric layer 24a and a first metal layer 25a stacked on the first dielectric layer 24a. Further, the first dielectric layer 24a flows into the cavity 200 to cover side surfaces of the electronic elements 22. The first dielectric layer 24a and the first metal layer 25a can be made of a resin-coated copper foil. The first conductive bumps 23a penetrate the first dielectric layer 23a so as to be in contact with the first metal layer 25a. Then, the adhesive layer 21 is removed to expose the second active surfaces 22b and the second electrode pads 221b of the electronic elements 22 from the second surface 20b of the substrate 20.

Figure 2E:
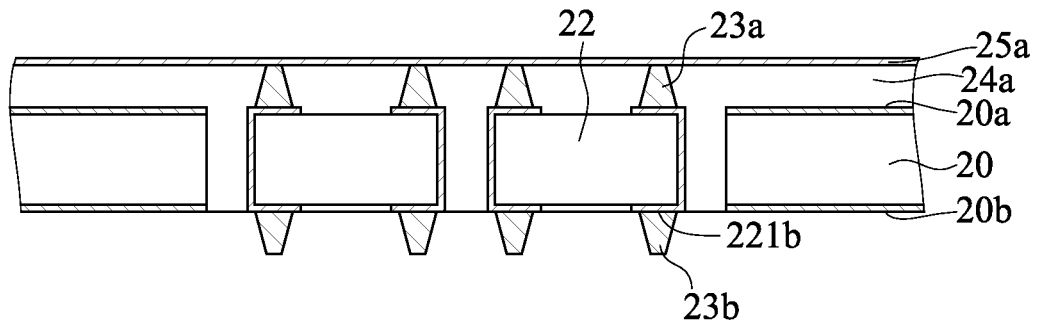

Referring to FIG. 2E, a plurality of second conductive bumps 23b made of such as silver paste are formed on the second electrode pads 221b by printing and heated so as to be cured. Each of the second conductive bumps 23b is bonded to the corresponding second electrode pad 221b through a bottom portion thereof and the bottom portion is greater in width than an opposite top portion of the second conductive bump 23b.

Figure 2F:
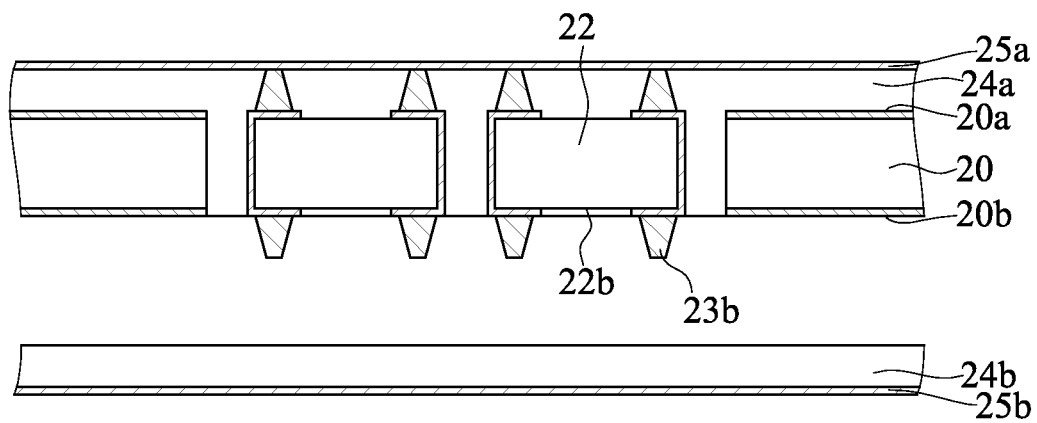
Figure 2G:
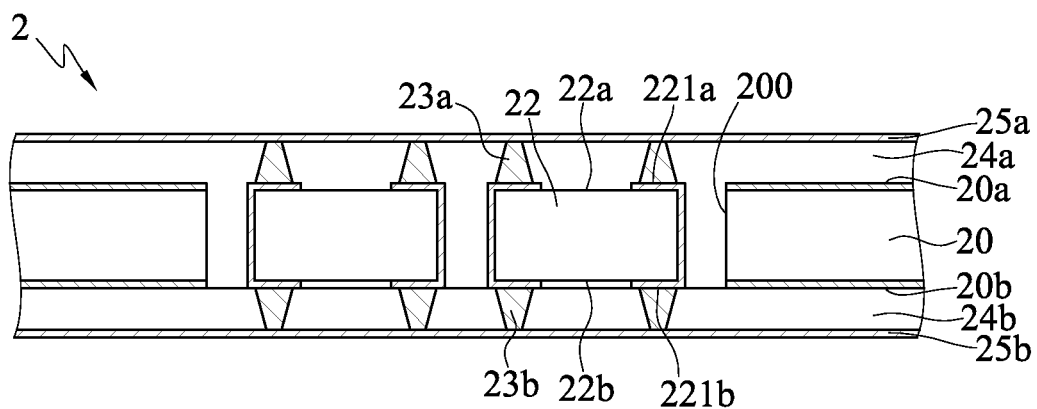

Referring to FIGS. 2F and 2G, the second surface 20b of the substrate 20 and the second active surfaces 22b of the electronic elements 22 are covered with a second dielectric layer 24b and a second metal layer 25b stacked on the second dielectric layer 24b. The second conductive bumps 23b penetrate the second dielectric layer 24b so as to be in contact with the second metal layer 25b, thereby electrically connecting the first metal layer 25a and the second metal layer 25b through the first conductive bumps 23a and the second conductive bumps 23b. As such, a circuit board structure 2 having a plurality of embedded electronic elements 22 is formed.

The present invention further provides a circuit board structure 2 having at least an embedded electronic element, which has: a substrate 20 having opposite first and second surfaces 20a, 20b; at least an electronic element 22 embedded in the substrate 20, wherein the electronic element 22 has a first active surface 22a having a plurality of first electrode pads 221a and a second active surface 22b opposite to the first active surface 22a and having a plurality of second electrode pads 221b, the first active surface 22a and the first electrode pads 221a of the electronic element 22 being exposed from the first surface 20a of the substrate 20; a plurality of first conductive bumps 23a formed on the first electrode pads 221a of the electronic element 22, wherein each of the first conductive bumps 23a is bonded to the corresponding first electrode pad 221a through a bottom portion thereof and the bottom portion is greater in width than an opposite top portion of the first conductive bump 23a; a first dielectric layer 24a formed on the first surface 20a of the substrate 20 and the first active surface 22a of the electronic element 22 and penetrated by the first conductive bumps 23a; and a first metal layer 25a formed on the first dielectric layer 24a and the first conductive bumps 23a and in contact with the first conductive bumps 23a.

In the above-described circuit board structure 2, a cavity 200 is formed in the substrate 20 to penetrate the first and second surfaces 20a, 20b, thus allowing the electronic element 22 to be disposed in the cavity 200 and exposing the second active surface 22b and the second electrode pads 221b of the electronic element 22 from the second surface 20b of the substrate 20. Therefore, the circuit board structure 2 further has: a plurality of second conductive bumps 23b formed on the second electrode pads 221b, wherein each of the second conductive bumps 23b is bonded to the corresponding second electrode pad 221b through a bottom portion thereof and the bottom portion is greater in width than an opposite top portion of the second conductive bump 23b; a second dielectric layer 24b formed on the second surface 20b of the substrate 20 and the second active surface 22b of the electronic element 22 and penetrated by the second conductive bumps 23b; and a second metal layer 25b formed on the second dielectric layer 24b and the second conductive bumps 23b and in contact with the second conductive bumps 23b.

In the present embodiment, the first conductive bumps 23a are made of silver paste. The electronic element 22 is a capacitor, such as a multi-layer ceramic capacitor (MLCC).

Therefore, the present invention dispenses with the conventional laser drilling, electroless plating and electroplating processes so as to simplify the fabrication process, reduce the fabrication cost and save the fabrication time.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a circuit board structure having at least an embedded electronic element, comprising the steps of:
    providing a substrate having opposite first and second surfaces and embedding at least an electronic element in the substrate, wherein the electronic element has a first active surface having a plurality of first electrode pads and a second active surface opposite to the first active surface and having a plurality of second electrode pads, the first active surface and the first electrode pads of the electronic element being exposed from the first surface of the substrate;
    forming a plurality of first conductive bumps on the first electrode pads of the electronic element; and
    after the plurality of first conductive bumps are formed on the first electrode pads of the electronic element, covering the first surface of the substrate and the first active surface of the electronic element with a first dielectric layer and a first metal layer stacked on the first dielectric layer, wherein the first conductive bumps penetrate the first dielectric layer so as to be in contact with the first metal layer.

2. The method of claim 1, wherein a cavity is formed in the substrate to penetrate the first and second surfaces and an adhesive layer is attached to the second surface of the substrate to cover one end of the cavity, thus allowing the electronic element to be disposed on the adhesive layer in the cavity, therefore, after covering the first surface of the substrate and the first active surface of the electronic element with the first dielectric layer and the first metal layer stacked on the first dielectric layer, the method further comprises:
    removing the adhesive layer to expose the second active surface and the second electrode pads of the electronic element from the second surface of the substrate;
    forming a plurality of second conductive bumps on the second electrode pads; and
    covering the second surface of the substrate and the second active surface of the electronic element with a second dielectric layer and a second metal layer stacked on the second dielectric layer, wherein the second conductive bumps penetrate the second dielectric layer so as to be in contact with the second metal layer.

3. The method of claim 1, wherein the first conductive bumps are made of silver paste.

4. The method of claim 1, after forming the first conductive bumps, further comprising heating the first conductive bumps.

5. The method of claim 1, wherein the electronic element is a capacitor.

6. The method of claim 1, wherein the stacked first dielectric layer and the first metal layer are made of a resin-coated copper foil.

* * * * *